United States Patent
Balakrishnan et al.

(10) Patent No.: US 8,477,889 B2
(45) Date of Patent: Jul. 2, 2013

(54) ESTIMATING AND FILTERING MULTIPLE SETS OF MIPS FROM DIFFERENT FREQUENCIES

(75) Inventors: Jaiganesh Balakrishnan, Bangalore (IN); Prashant Kota, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 621 days.

(21) Appl. No.: 12/712,216

(22) Filed: Feb. 25, 2010

(65) Prior Publication Data
US 2010/0232490 A1 Sep. 16, 2010

(30) Foreign Application Priority Data
Mar. 11, 2009 (IN) .............................. 547/CHE/2009

(51) Int. Cl.
*H03D 1/04* (2006.01)
(52) U.S. Cl.
USPC ........... 375/346; 375/324; 375/296; 375/329; 375/348; 375/350
(58) Field of Classification Search
USPC ................. 375/346, 260, 324, 284, 285, 296, 375/329, 348, 350
See application file for complete search history.

(56) References Cited

U.S. PATENT DOCUMENTS

| | | | |
|---|---|---|---|
| 2004/0203472 A1* | 10/2004 | Chien | 455/68 |
| 2007/0099570 A1* | 5/2007 | Gao et al. | 455/63.1 |
| 2009/0068974 A1* | 3/2009 | Smith | 455/304 |

* cited by examiner

*Primary Examiner* — Kabir A Timory
(74) *Attorney, Agent, or Firm* — Lawrence J. Bassuk; W. James Brady; Frederick J. Telecky, Jr.

(57) ABSTRACT

A method and apparatus for compensating a modulation imbalance effect in a communication device. In one embodiment, at least three sets of modulation imbalance parameters (MIPs) are estimated by executing an auto balance sequence. The at least three sets of MIPs correspond to a baseband signal configured to have at least three configurable frequencies, each of the at least three sets of MIPs corresponds to one of at least three configurable frequencies. The auto balance sequence is configured to provide an offset signal generated within a communication device to trigger generation of each one of the at least three configurable frequencies. The at least three sets of MIPs are filtered to select a filtered set. The modulation imbalance effect is compensated by using the filtered set to reduce distortion of the baseband signal in the communication device.

4 Claims, 6 Drawing Sheets

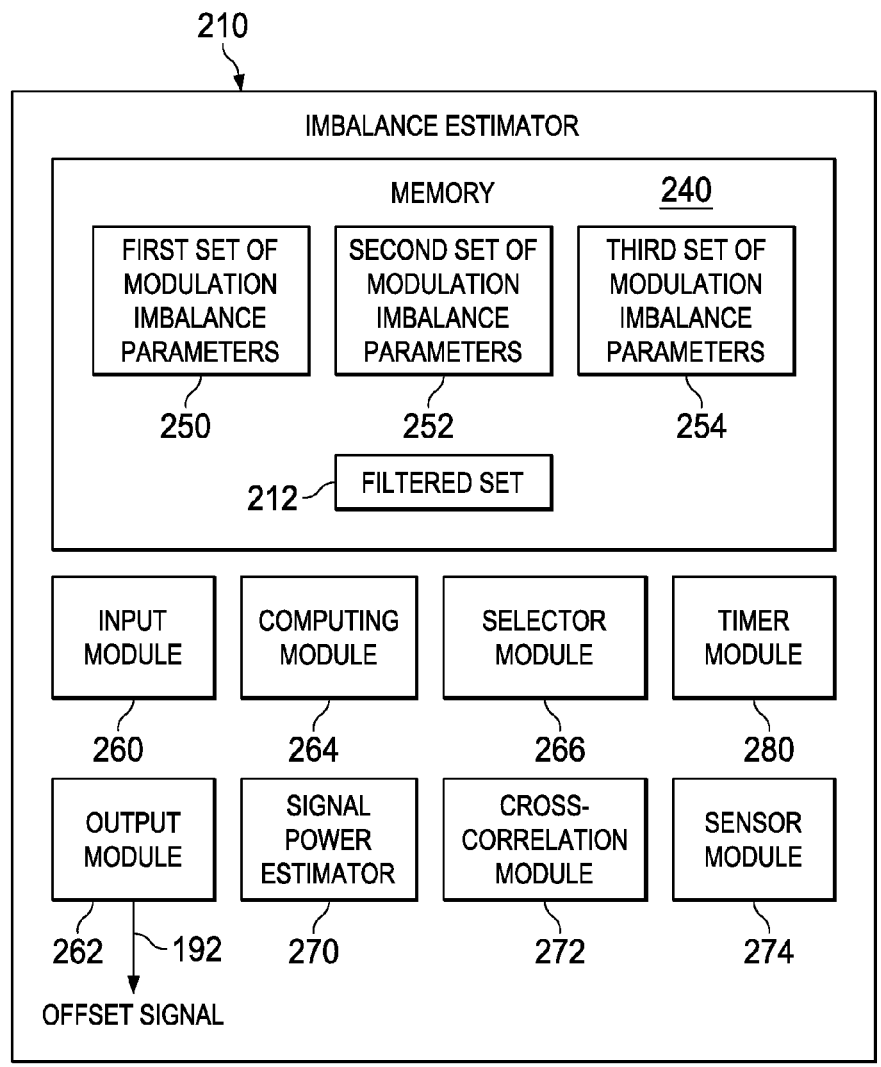

ESTIMATING AND FILTERING MULTIPLE SETS OF MIPS FROM DIFFERENT FREQUENCIES

CROSS REFERENCE TO RELATED APPLICATIONS

Benefit is claimed under 35 U.S.C. 119(a)-(d) to Foreign application Serial No. 547/CHE/2009, filed on 11 Mar. 2009, in Chennai, India, entitled 'Method And Apparatus For Blind I/Q Imbalance Estimation For Correlated Signals', which is herein incorporated in its entirety by reference for all purposes.

TECHNICAL FIELD

Embodiments of the disclosure generally relates to the field of electronics, and more particularly to an improved method and apparatus for wireless communications.

BACKGROUND

Communication systems operating in a radio frequency (RF) spectrum often deploy modulation techniques (e.g., frequency modulation, amplitude modulation, I/Q modulation, and others) for modulating signals or data streams (in case of in-phase/quadrature (I/Q) modulation, the signals may typically refer to as in-phase "I" component and quadrature "Q" component) onto a common carrier. In practical communication systems, virtually all analog components that may be used in communication devices to perform basic signal processing functions such as signal generation, mixing, filtering, and others are imperfect and are often mismatched. Unavoidable tolerances in the manufacturing process for electronic devices lead to imperfections that may introduce unequal amount of distortion and error in the processing of I/Q signals. I/Q imbalances may manifest themselves as a gain and phase imbalance in the I/Q branches or chains (formed by the imperfect or mismatched components), thereby generating deviations from the desired 90° phase shift and the desired equal gain in the I/Q branches.

Several techniques such as a training-based estimation technique and a blind (or non-reference signal based) estimation technique may be used to mitigate the effects of I/Q imbalances in a communication device. These techniques typically estimate the I/Q gain and phase imbalance parameters to digitally compensate for the error. However, many of the techniques may place undesirable restrictions or limitations on the communication systems such as a need to inject a known calibration (or pilot or reference) signal into the receiver and similar others.

SUMMARY

This summary is provided to comply with 37 C.F.R. §1.73, requiring a summary of the invention briefly indicating the nature and substance of the invention. It is submitted with the understanding that it will not be used to interpret or limit the scope or meaning of the claims.

A method and apparatus for blind in-phase/quadrature (I/Q) imbalance estimation for correlated signals is disclosed. In one aspect, in a method for compensating a modulation imbalance effect in a communication device, at least three sets of modulation imbalance parameters (MIPs) are estimated by executing an auto balance sequence. A filtered set of the MIPs is then selected by filtering the at least three sets of MIPs. Further, the modulation imbalance effect is compensated in the communication device using the selected filtered set of MIPs.

In another aspect, a non-transitory computer readable storage medium (NTCRSM) for compensating a modulation imbalance effect in a communications device has instructions that, when executed by a computer system, cause the computer system to perform the method described above.

In yet another aspect, an apparatus includes an analog front-end (AFE) module configured to receive a modulated input signal having I/Q components. The AFE module includes a local oscillator (LO) and a pair of analog-to-digital (A/D) converters. The LO is configurable to generate a LO signal having at least three configurable frequencies for demodulating the modulated input signal and the pair of A/D converters is configurable to digitize demodulated I/Q components into a first digital data stream (FDDS) and the quadrature intermediate frequency QIF signal into a second digital data stream (SDDS) respectively. The apparatus also includes an imbalance estimator configured to receive the FDDS and the SDDS. The imbalance estimator is configured to select a filtered set from the at least three sets of MIPs corresponding to the at least three configurable frequencies. The imbalance estimator is also configured to provide an offset signal to the LO, where the offset signal is used to select a frequency of the LO to be one of the at least three configurable frequencies.

Other features of the embodiments will be apparent from the accompanying drawings and from the detailed description that follows.

BRIEF DESCRIPTION OF THE VIEWS OF DRAWINGS

FIG. 2B illustrates a matrix-based digital computation performed by an imbalance estimator described with reference to FIG. 2A.

FIG. 2C illustrates additional details of an imbalance estimator described with reference to FIG. 2A.

DETAILED DESCRIPTION

Figure 1:
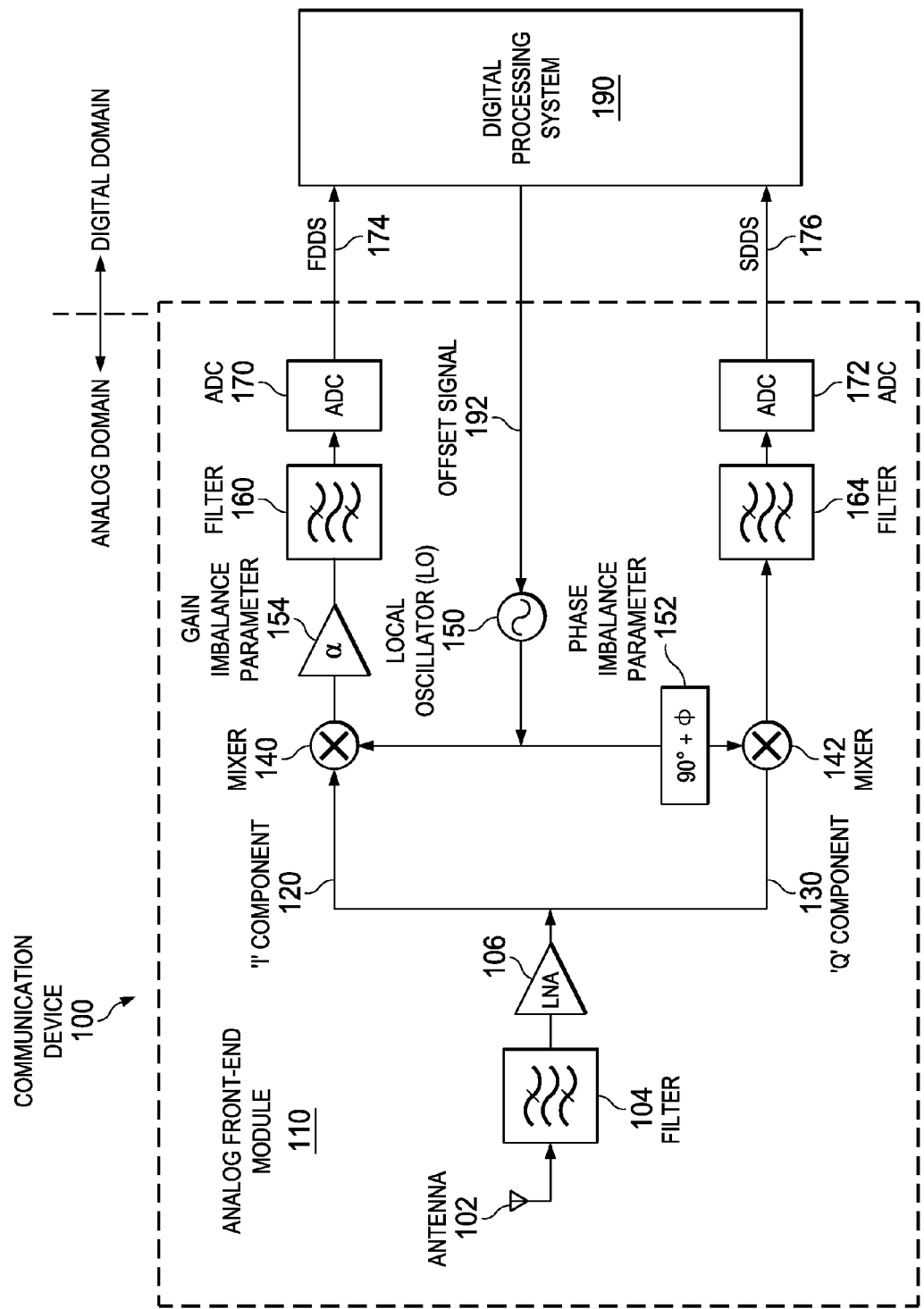
FIG. 1 illustrates a block diagram of a communication device, according to one embodiment.

Methods and systems for blind in-phase/quadrature (I/Q) imbalance estimation for correlated signals are disclosed. The following description is merely exemplary in nature and is not intended to limit the present disclosure, applications, or uses. It should be understood that throughout the drawings, corresponding reference numerals indicate like or corresponding parts and features. In various embodiments, configuration describes a set up of an element, a circuit, a package, an electronic device, and similar other, and refers to a process for setting, defining, or selecting particular properties, parameters, or attributes of the device prior to its use or during its use. A set of configuration attributes may be selected to have a default value. For example, a gain of an amplifier may be configured to be equal to one (1) to enable an output signal to simply track an input signal.

According to an embodiment, an apparatus and method for compensating a modulation imbalance effect in a communication device includes estimating at least three sets of modulation imbalance parameters (MIPs) by executing an auto balance sequence. The at least three sets of MIPs correspond to a baseband signal configured to have at least three configurable frequencies, each of the at least three sets of MIPs corresponding to at least one of three configurable frequencies. The auto balance sequence is configured to provide an offset signal generated within the communication device to trigger generation of each one of the at least three configurable frequencies. The at least three sets of MIPs are filtered to select a filtered set. The modulation imbalance effect is compensated using the selected filtered set to reduce the distortion of the baseband signal.

FIG. 1 illustrates a block diagram of a communication device 100, according to one embodiment. The communication device 100 includes an analog front-end (AFE) module 110 configured to receive and process wireless signals and provide a digital data stream representing the signals to a digital processing system 190. The AFE module 110 includes an antenna 102, a low noise amplifier (LNA) 106, a local oscillator (LO) 150, a mixer 140, a mixer 142, a filter 160, a filter 164, an analog-to-digital converter (ADC) 170, and an ADC (ADC) 172.

Multiple channels of data can share a single transmission medium, but a transceiver may desire data from one channel. Therefore, to isolate the desired channel for further processing, transceivers typically perform at least three operations on the received signal: (1) the undesired channels are filtered out; (2) the desired channel is "shifted" to lower or zero frequency signal, where it can be processed; and (3) the signal is amplified. Shifting a signal may be accomplished by mixing the signal with a LO signal.

The antenna 102 is configured to receive wireless signals transmitted by various sources (not shown). Transmitting sources typically use carrier signals transmitted over one or more channels to convey desired information to receivers. These carrier signals may be radio frequency (RF) signals having a sinusoidal waveform that are typically amplitude, frequency, or phase (or a combination thereof) modulated in response to information to be transmitted. The nominal frequency of the carrier signals is known as the carrier frequency (fc).

The signal received by the antenna 102, which may include one or more RF channels, includes a signal of interest at a carrier frequency $f_c$ and one or more interfering signals (may also be referred to as undesired signals). The interfering signal may also be referred to as an image signal if the receiver is a low-IF receiver and the interferer falls in its image band. The signal received by the antenna 102 is filtered by the filter 104 to filter out undesirable signal frequencies, e.g., a band pass filter to remove high signal frequencies. The filtered signal having the signal of interest as well as interfering signals is provided to the LNA 106 for amplification. The filtered, amplified signal, which is a low-IF signal, is down-converted and demodulated (these may be performed in one or more stages, with some of the subsequent stages being processed in the digital domain) to recover the desired information.

In the depicted embodiment, the filtered, amplified signal includes an in-phase (I) component 120 and a quadrature phase (Q) component 130. Signal processing for the I and Q components occurs in two parallel branches or chains. In communication systems, e.g., the communication device 100, imperfections and mismatched components used in the LO 150, or the I and Q branches cause mismatched signal flows, thereby causing an imbalance in the flow of signals between the I and Q branches. The imbalance may cause deviations from the desired 90° phase shift and the desired equal gain in the I and the Q branches.

The LO 150 (may also be referred to as a synthesizer 150) is configurable to generate a LO signal having an I component and a Q component, the LO signal being used to perform a first stage down-conversion and demodulation signal processing operation towards the recovery of the desired information. The LO signal may be generated to have at least three configurable frequencies, e.g., a first frequency $f_1$, a second frequency $f_2$, and a third frequency $f_3$. Additionally, the LO 150 may be configured to adjust the configurable frequency to one of $f_1$, $f_2$, or $f_3$ in response to receiving an offset signal 192 as a control signal. In an embodiment, a difference between any two out of the three frequencies may be referred to as an offset frequency and the offset frequency may be small (e.g., 1% or a configurable number that is less than a desirable threshold value) compared to any one of the $f_1$, $f_2$ or $f_3$ frequencies. Although not shown, it is understood that the LO 150 may be implemented using known communication modules such as a phase locked loop (PLL), divider, counter, and other circuits. In the PLL implementation, the frequency of the LO 150 may be adjusted by adjusting a value of a divisor.

The mixer 140 is operable to down-convert the signal of interest from its carrier frequency $f_c$ to a lower in-phase intermediate frequency (IIF) signal having frequency $f_{IIF}$. The down-conversion process may utilize a multiplication between the mixer input (I component 120 received from the LNA 106) and an input LO signal from the LO 150 where, for a low side injection, the LO signal frequency is less than the RF signal frequency (e.g., the IF frequency $f_{IIF}$ is positive) and for a high side injection, the LO signal frequency is greater than RF signal frequency (e.g., IIF frequency $f_{IIF}$ is negative). That is, the mixer 140 mixes the signal of interest received as the I component 120 received from the LNA 106 and the LO signal frequency to provide the IIF signal having the frequency $f_{IIF}$. The frequency $f_{IIF}$ may be adjusted to any value ranging from +$f_{IIF}$ to -$f_{IIF}$, including 0 (for a zero-IF transceiver). In a zero-IF transceiver, the frequency of the LO 150 is configured to be equal to the carrier frequency $f_c$. The filter 160, e.g., a low pass filter centered around the $f_{IIF}$ frequency, is operable to filter out image blocker signals and allow the signal of interest to pass through to the ADC 170.

Similarly, the mixer 142 is operable to down-convert the signal of interest from its carrier frequency $f_c$ to a lower quadrature intermediate frequency (QIF) signal having the frequency $f_{QIF}$. Since, the intermediate frequencies for the I component and Q component are the same, $f_{QIF}$ is the same as $f_{IIF}$. The down-conversion process may utilize a multiplication between the mixer input (Q component 130 received from the LNA 106) and an input LO signal (phase shifted by 90°+Ø) from the LO 150 where for a low side injection, the LO signal frequency is less than the RF signal frequency (e.g., the QIF frequency $f_{QIF}$ is positive) and for a high side injection the LO signal frequency is greater than RF signal frequency (e.g., QIF frequency $f_{QIF}$ is negative). That is, the mixer 142 mixes the signal of interest received as the Q component 130 received from the LNA 106 and the orthogonal LO signal to provide the QIF signal having the frequency $f_{QIF}$. The frequency $f_{QIF}$ may be adjusted to any value ranging from $+f_{QIF}$ to $-f_{QIF}$, including 0 (for a zero-IF transceiver). In a zero-IF transceiver, the frequency of the LO 150 is configured to be equal to the carrier frequency fc. The filter 164, e.g., a low pass filter centered around the $f_{QIF}$ frequency, is operable to filter out image blocker signals and allow the signal of interest to pass through to the ADC 172.

In some applications, infinite image rejection may be provided if the LO 150 provides equal amplitudes and a phase difference of exactly 90° in the I and Q branches of the signal processing path. The gain imbalance parameter α (alpha) 154 denotes the gain imbalance between the I and Q branches and the phase imbalance parameter Ø (phi) 152 denotes the phase imbalance between the I and Q branches. The combination of [α, Ø] imbalance parameters may be referred to as a set of MIPs. Under balanced conditions, values for α 154 and Ø 152 are respectively 1 and zero. In the presence of I/Q imbalance, the image blocker rejection may be limited. For example, in a particular transceiver using analog front-end components, an amplitude imbalance of 1-2% and a phase imbalance of 1-2° may be likely, thereby resulting in an image attenuation of about 30-40 dB only compared to a desirable attenuation of 50-60 dB.

As described earlier, existence of a correlation between the I and Q components may introduce a 'bias' in the I/Q imbalance parameter estimation. The bias, which may depend on a level of correlation between the I and Q components as well as the gain and phase imbalance parameters, may degrade receiver performance (e.g., image blocker specification). To illustrate the bias in the blind I/Q estimation in the presence of correlated signals, a simple two tone scenario may be considered. In this scenario, the receiver may be assumed to have no gain or phase imbalance. Equation E100 defines a received base-band waveform which consists of a signal centered at $-f_{IF}$ and a blocker at $f_{IF}$. The image blocker component has a relative phase offset of 0 and an amplitude of γ.

$$y(t) = \underbrace{\exp(-j2\pi f_{IF}t)}_{Signal} + \underbrace{\gamma \exp(j2\pi f_{IF}t + \theta)}_{Blocker} \quad \text{Equation E100}$$

$$= \underbrace{\{\cos(2\pi f_{IF}t) + \gamma\cos(2\pi f_{IF}t + \theta)\}}_{Signal} +$$

$$\underbrace{j\{-\sin(2\pi f_{IF}t) + \gamma\sin(2\pi f_{IF}t + \theta)\}}_{Blocker}$$

where $-f_{IF}$ and $f_{IF}$ are the center frequencies of the received baseband signal and the blocker, respectively, θ is the relative phase offset of the blocker and γ is the relative amplitude of the blocker, and t is the time instant.

It is easy to observe per Equation E102 that the base-band waveform has I and Q streams which are correlated and have different variances.

$$R_{II}=1+\gamma^2+2\gamma \cos(\theta); \; R_{IQ}=2\gamma \sin(\theta)$$

$$R_{QQ}=1+\gamma^2-2\gamma \cos(\theta). \quad \text{Equation E102}$$

where $R_{II}$ is the auto-correlation of the received I component and $R_{QQ}$ is the auto-correlation of the received Q component, $R_{IQ}$ is the cross-correlation between the I and Q components.

Therefore, even in the absence of any I/Q imbalance, a blind estimation based I/Q estimator may indicate an imbalance. Effectively, there is a bias in the blind I/Q gain and phase estimates. The bias depends on the magnitude of θ and γ.

A simple matrix equation E104 relates effect of modulation imbalance parameters (MIP) on I/Q chain signal processing.

$$\begin{bmatrix} z_I \\ z_Q \end{bmatrix} = M \begin{bmatrix} y_I \\ y_Q \end{bmatrix} = \begin{bmatrix} \alpha & 0 \\ \sin\phi & \cos\phi \end{bmatrix} \begin{bmatrix} y_I \\ y_Q \end{bmatrix}. \quad \text{Equation E104}$$

Where, the matrix Z having elements $Z_I$ and $Z_Q$ represent output signals, the matrix M represents the gain and phase mismatch parameters α and Ø, and the matrix Y having elements $Y_I$ and $Y_Q$ represents input signals. The input signals, as described with reference to Equation E104, refer to an equivalent base-band signal prior to gain/phase imbalance. Thus, if elements of the matrix M are known, then for known output signals, the input signals may be reconstructed by multiplying the matrix Z with an inverse of matrix M (or $M^{-1}$), as described by Equation E120. Additional details of estimating values of M and using the estimated values to reconstruct the input signals may be performed by the digital signal processing system 190, the additional details being described with reference to FIGS. 2A and 2B.

Equation E110 shows spectral mixing of positive and negative frequencies in the presence of I/Q imbalance.

$$\begin{bmatrix} \alpha & 0 \\ 0 & 1 \end{bmatrix} \underbrace{\begin{bmatrix} \cos(2\pi f_{IF}t) \\ \sin(2\pi f_{IF}t) \end{bmatrix}}_{\exp(j2\pi f_{IF}t)} = \quad \text{Equation E110}$$

$$\left(1+\frac{\alpha}{2}\right) \underbrace{\begin{bmatrix} \cos(2\pi f_{IF}t) \\ \sin(2\pi f_{IF}t) \end{bmatrix}}_{\exp(j2\pi f_{IF}t)} + \frac{\alpha}{2} \underbrace{\begin{bmatrix} \cos(2\pi f_{IF}t) \\ -\sin(2\pi f_{IF}t) \end{bmatrix}}_{\exp(-j2\pi f_{IF}t)}$$

where Ø is 0°, $f_{IF}$ is the frequency of the baseband signal. The tone frequency referred to herein is after the down-conversion process.

Equation E120 shows that if values for the I/Q modulation imbalance parameters (MIP) α and Ø are known, they may be used to digitally compensate for the I/Q imbalance.

$$\begin{bmatrix} v_I \\ v_Q \end{bmatrix} = M^{-1} \begin{bmatrix} z_I \\ z_Q \end{bmatrix} = \frac{1}{\hat{\alpha}} \begin{bmatrix} 1 & 0 \\ -\tan(\hat{\phi}) & \hat{\alpha}\sec(\hat{\phi}) \end{bmatrix} \begin{bmatrix} z_I \\ z_Q \end{bmatrix} \quad \text{Equation E120}$$

where the matrix Z represents the input signals with I/Q imbalance, $M^{-1}$ is the inverse of the imbalance parameter matrix, and the matrix V represents the I/Q imbalance compensated output signals.

In low-IF receivers, I/Q imbalance causes the blocker signal located at the image frequency to fold-back in-band. Due to the non-zero IF, the image signal originates from a different carrier frequency than the desired signal and the image signal may be more than 50 dB stronger than the desired signal. In such a scenario, the image attenuation provided by the analog I/Q signal processing alone may be insufficient. As the blocker may be much stronger than the desired signal, low-IF architectures may be able to tolerate a relatively small level of I/Q imbalance. For example, with a +25 dB blocker, at least 55 dB of image suppression is required for a signal SNR of 30 dB and a 55 dB image suppression requires gain imbalance of <0.02 dB and a phase imbalance of <0.1 degrees.

In zero-IF receivers, I/Q imbalance causes self-mixing of the in-band signal as the spectrum from negative frequencies fold back on to the positive frequencies. As the 'interference' that folds-back has same energy as the signal of interest, a higher I/Q imbalance can be tolerated for the same required SNR.

The ADC 170 is operable to receive and convert an analog filtered signal (may also be referred to as a baseband signal, which may still be modulated for multi-stage 1F receivers or may be fully demodulated for zero-IF receiver) provided by the first filter 160 included in the analog domain to a first digital data stream (FDDS) 174 in the digital domain. That is, the ADC 170 is configured to convert continuous time signals in the analog domain to their discrete time equivalents in the digital domain. The DDS 174 is a continuous stream of individual discrete-time sampled data (e.g., bit stream) that makes up an I component data stream.

Similarly, the ADC 172 is operable to receive and convert an analog filtered signal (may also be referred to as a baseband signal, which may still be modulated for multi-stage 1F receivers or may be fully demodulated for zero-IF receiver) provided by the filter 164 included in the analog domain to a second digital data stream (SDDS) 176 in the digital domain. That is, the ADC 172 is configured to convert continuous time signals in the analog domain to their discrete time equivalents in the digital domain. The SDDS 176 is a continuous stream of individual discrete-time sampled data (e.g., bit stream) that makes up a Q component data stream. The I/Q data stream is then processed by the digital signal processing system 190. Additional details of the digital signal processing system 190 are described with reference to FIGS. 2A-2C.

Although not shown, it is understood that the communication device 100 may include other components or modules, e.g., a digital-to-analog (DAC) converter, a speaker, a power supply, and others. In addition, the components or modules described with reference to FIG. 1 may also be arranged differently from the configuration shown in FIG. 1. For example, filters and/or amplifiers may be added before and/or after each mixer. Such alternative exemplary embodiments are contemplated to be within the scope of the present disclosure.

Figure 2A:
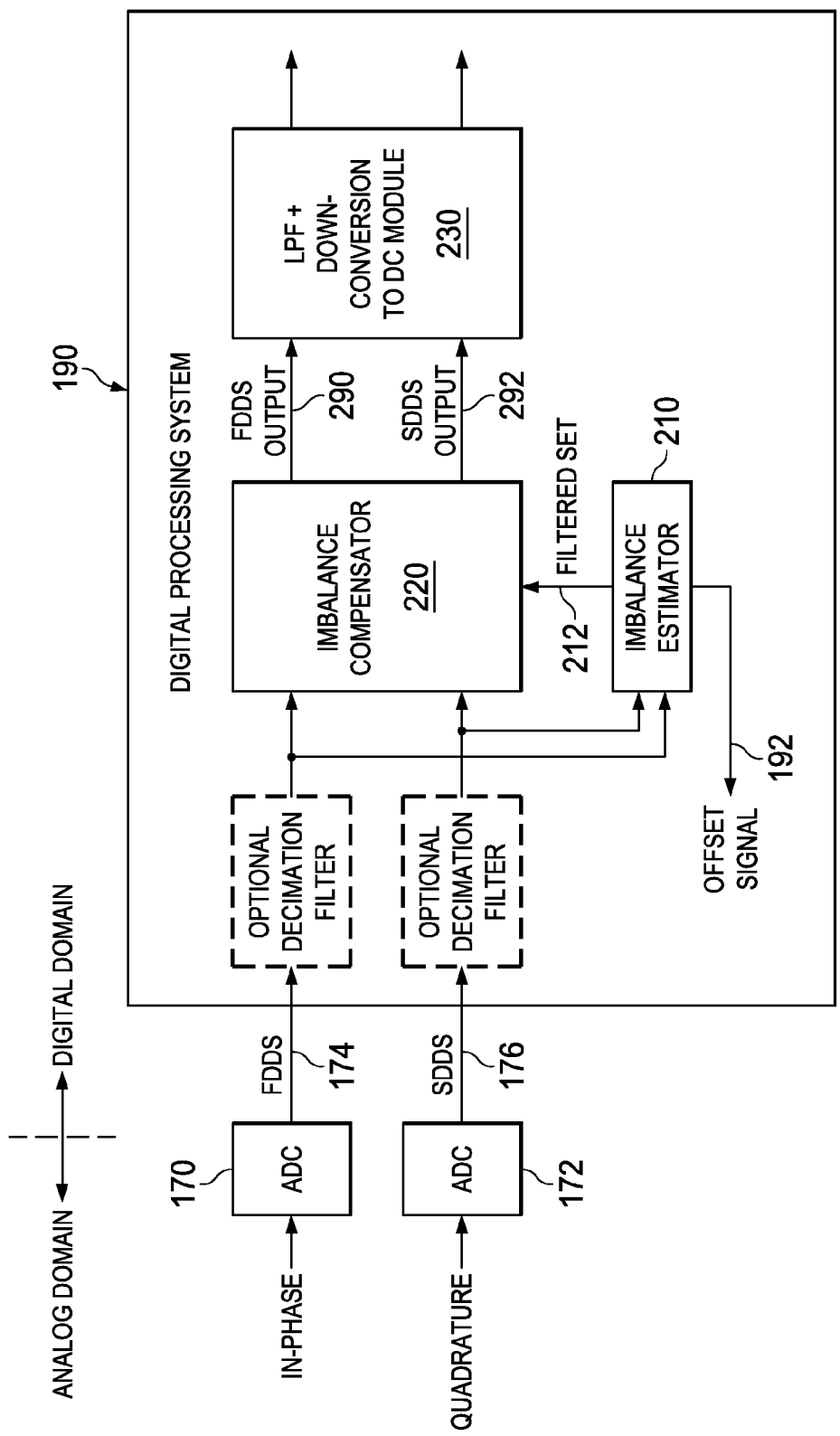
FIG. 2A illustrates additional details of a digital processing system described with reference to FIG. 1.

FIG. 2A illustrates additional details of the digital processing system 190 described with reference to FIG. 1. The digital processing system 190, which operates in a digital domain, includes an imbalance estimator 210 and an imbalance compensator 220 coupled to each other to receive the FDDS 174 and the SDDS 176 signals. The digital processing system 190 may include an optional decimation filter to reduce the number of discrete samples in order to perform functions such as filtering off unwanted signals and improving the resolution of the digital conversion. With the optional filter, the FDDS 174 and the SDDS 176 signals may have reduced number of samples. However, with or without the optional filter, the FDDS 174 and the SDDS 176 signals are representative of the I and Q branch continuous time signals in the analog domain.

The imbalance estimator 210 performs estimation of a first set of I/Q MIPs α and Ø by performing computations on the FDDS 174 and the SDDS 176 samples associated with a particular frequency of the LO 150, e.g., frequency $f_1$. Additional details of the estimation process are described with reference to FIGS. 2B and 2C. The imbalance estimator 210 is operable to generate the offset signal 192 and send it to the LO 150 to offset the LO frequency, e.g., from $f_1$ to $f_2$. The process of estimation of a second set I/Q modulation imbalance parameters (MIPs) is repeated by performing computations on the FDDS 174 and the SDDS 176 samples associated with the frequency $f_2$. After collecting at least three sets of MIPs corresponding to the at least three configurable frequencies $f_1$, $f_2$ and $f_3$, the imbalance estimator 210 selects a filtered set 212 (which includes optimized values for α and Ø), which is communicated to the imbalance compensator 220. The selection of values included in the filtered set 212 may include discarding the outliers from the multiple sets of MIPs and selecting a set corresponding to a median of the three sets of MIPs. Thus, for the case in which the median is computed from the three sets of MIPs, the filtered set 212 is selected by discarding the two outliers. In the case of the number of sets being greater than three, there may be multiple possibilities e.g., (i) picking the filtered set (ii) removing outliers, and iii) picking the average of the rest. Additional details of the computation of the filtered set 212 by the imbalance estimator 210 are described with reference to FIG. 2C.

FIG. 2B illustrates a matrix-based digital computation performed by the imbalance estimator 210 described with reference to FIG. 2A. The imbalance compensator 220 uses Equations E102 and E120 to multiply $M^{-1}$ and matrix Z=[FDDS 174, SDDS 176] to generate matrix V=[FDDS output 290, SDDS output 292] that digitally compensates for or corrects the I/Q imbalance. Referring back to FIG. 2A, a LPF+down-conversion to DC module 230 may be configured to receive the compensated FDDS output 290 and SDDS output 292 signals to perform low pass filtering and down conversion in low IF systems. The I/Q imbalance correction is preferably performed prior to any complex digital filtering, e.g., the LPF+down-conversion to DC module 230 is disposed downstream to the imbalance compensator 220.

FIG. 2C illustrates additional details of the imbalance estimator 210 described with reference to FIG. 2A. The imbalance estimator 210 includes a memory 240 configured to store discrete samples for the FDDS 174 and SDDS 176 bit streams. Also stored in the memory 240 are values for a first set of MIPs 250, a second set of MIPs 252, a third set of MIPs 254, and a filtered set 212. The imbalance estimator 210 also includes the following modules: 1) an input module 260 coupled to receive a trigger input to initiate an update of the filtered set 212, 2) an output module 262 coupled to provide the offset signal 192 to the LO 150, 3) a signal power estimator 270 configured to estimate a gain imbalance parameter a by comparing signal energy of the FDDS 174 and SDDS 176 signals, 4) a cross-correlation module 272 configured to estimate a phase imbalance parameter Ø by computing cross-correlation between the FDDS and SDDS 174 and 176 signals, 5) a timer module 280 configured to generate the trigger input in response to an expiration of a configurable time period, 6) a sensor module 274 configured to generate the trigger input in response to the sensor module 274 detecting a temperature of the apparatus exceeding a configurable threshold, 7) a computing module 264 configured to compute a final inverse square root estimate for an imbalance parameter included in the at least three sets of MIPs from an initial estimate using a Newton Raphson approximation, and 8) a selector module 266 operable to sort the at least three sets of MIPs and to select the filtered set 212.

The computing module 264 uses Equation E200 to estimate the gain imbalance parameter α by comparing signal energy or power associated with the I and Q inputs, e.g., FDDS 174 and SDDS 176.

$$\hat{\alpha} = \sqrt{\frac{R_{II}}{R_{QQ}}} = \sqrt{\frac{\sum_{n=0}^{N-1} |Z_I(n)|^2}{\sum_{n=0}^{N-1} |Z_Q(n)|^2}}$$

Equation E200 where, $R_{II}$ is the auto-correlation of the received in-phase component and $R_{QQ}$ is the auto-correlation of the received quadrature component, $Z_I$ and $Z_Q$ represents the FDDS 174 and SDDS 176 signals, and $\hat{\alpha}$ is the gain imbalance estimate.

In addition, the computing module 264 uses Equation E210 to estimate the phase imbalance parameter Ø by computing the cross-correlation between the I and Q inputs, e.g., FDDS 174 and SDDS 176.

$$\sin(\hat{\phi}) = \frac{R_{IQ}}{\hat{\alpha} R_{QQ}} = \frac{\sum_{n=0}^{N-1}\{Z_I(n)Z_Q(n)\}}{\hat{\alpha}\sum_{n=0}^{N-1}|Z_Q(n)|^2} \qquad \text{Equation E210}$$

$$\sec(\hat{\phi}) = \sqrt{\frac{1}{1-\sin^2(\hat{\phi})}}\,;\ \tan(\hat{\phi}) = \sin(\hat{\phi})\sec(\hat{\phi})$$

Where, $R_{II}$ is the auto-correlation of the received in-phase component and $R_{QQ}$ is the auto-correlation of the received quadrature component, $R_{IQ}$ is the cross-correlation between the I and Q components, $Z_I$ and $Z_Q$ represents the FDDS 174 and SDDS 176 signals, $\hat{\alpha}$ is the gain imbalance estimate, and $\hat{\phi}$ is the phase imbalance estimate.

Estimation of the I/Q imbalance parameters as defined in Equations E200 and E210, uses the computation of inverse square roots. Current techniques to implement the inverse square root computation typically rely on the use of a look-up table (LUT) approach. In the LUT based approach, the input range may be divided in to small intervals and the output may be pre-stored. However, the LUT based approach uses up significant memory if implemented in software or requires large digital silicon area if implemented in hardware or firmware. As a result, the input range for the square root inverse operation may have to be limited due to the area penalty. In addition, the accuracy of the LUT based approach may be limited by the input step-size of the LUT.

The variances and the correlation between the I and Q streams of a correlated signal can be modified by introducing a frequency offset at the receiver, e.g., at the LO 150. That is, by introducing a frequency offset Δf to the base-band waveform, I and Q streams that may be correlated become uncorrelated and have the same variance in response to the offset, thereby removing any bias. Equation E100 (described with reference to one example) may be rewritten as Equation E220 that defines a received base-band waveform which consists of a signal centered at $-f_{IF}+\Delta f$ and a blocker at $f_{IF}+\Delta f$. The image blocker component has a relative phase offset of θ and an amplitude of γ. Equation E220

$$y(t) = \underbrace{\exp(-j2\pi f_{IF}t + j2\pi\Delta ft)}_{Signal} + \underbrace{\gamma\exp(j2\pi f_{IF}t + +j2\pi\Delta ft\theta)}_{Blocker}$$

$$= \underbrace{\{\cos(2\pi f_{IF}t - 2\pi\Delta ft) + \gamma\cos(2\pi f_{IF}t + 2\pi\Delta ft + \theta)\}}_{Signal} +$$

$$\underbrace{j\{-\sin(2\pi f_{IF}t - 2\pi\Delta ft) + \gamma\sin(2\pi f_{IF}t + 2\pi\Delta ft + \theta)\}}_{Blocker}$$

where θ is the relative phase offset of the blocker and γ is the relative amplitude of the blocker, Δf is the frequency offset to the received baseband signal and blocker, centered at frequencies of $-f_{IF}$ and $f_{IF}$, respectively, and t is the time instant.

Thus, an introduction of the frequency offset Δf to the base-band waveform (e.g., by changing frequency of the LO 150 from $f_1$ to $f_2$, or $f_1$ to $f_3$, and others) ensures that the I and Q streams are now uncorrelated and have the same variance. Equation E230 uses Equation E102 for specific values of θ to verify that the bias of the blind I/Q estimator is zero.

$$R_{II}=1+\gamma^2;\ R_{IQ}=0$$

$$R_{QQ}=1+\gamma^2. \qquad \text{Equation E230}$$

Where $R_{II}$ is the auto-correlation of the received I component and $R_{QQ}$ is the auto-correlation of the received Q component, $R_{IQ}$ is the cross-correlation between the I and Q components, γ is the relative amplitude of the blocker.

In an embodiment, the correlation values are computed over a finite window of time (Tavg). Hence, to be effective in removing bias in I/Q estimation, the frequency offset Δf should preferably be chosen to be much larger than 1/Tavg. In an embodiment, an offset between the first frequency $f_1$ and one of the second frequency $f_2$ and the third frequency f3 is greater than 1/Tavg, where Tavg in a configurable time period between approximately 1 millisecond and approximately 100 milliseconds for RF signals. It is understood that, the time period may be greater than the 1-100 milliseconds exemplary range depending on factors like application, technology used, and others.

Performance of blind I/Q imbalance estimation varies as a function of the frequency offset. Specifically, the worst case performance (e.g., image suppression that is less than a desirable minimum) may occur at cumulative frequency offsets that are multiples of $f_t$, where $f_t$ is the audio tone frequency. In many communication systems, the RF signals generated at the transmitter and receiver are often derived from different reference local oscillators having different reference crystals. Thus, the differences in the outputs of the reference local oscillators at the transmitter and receiver create a carrier frequency offset, or simply a frequency offset $f_{off}$, at the receiver. Essentially, there is some residual modulation in the received signal (corresponding to the difference in the transmit and receive carriers), which occurs after down-conversion. The frequency offset creates distortion in the received signal resulting in higher bit error rates and lower throughput. As the frequency offset, $f_{off}$, is unknown, it may not be possible to determine the appropriate incremental frequency offset (Δf) that would be required to enhance the blind I/Q estimator. For example, if Δf is chosen to be $-f_{off}$, then the performance would be degraded.

Instead of performing one I/Q imbalance estimation (used by many conventional I/Q imbalance estimators), the I/Q imbalance estimation is performed multiple times to reduce distortion caused by correlated I/Q signal components. The imbalance estimator 210 deploys an enhanced estimation technique that performs multiple I/Q estimates, e.g, at least three estimates performed consecutively, with different frequency offsets, e.g., [0, Δf, −Δf], and selects one of the I/Q estimates with lower estimation error. If Δf is chosen appropriately, then only one of the three estimates may be poor. As the probability of occurrence of the poor estimate is low, two of the other estimates are guaranteed to be good.

The worst case error may occur only when the correlation between the positive and negative frequency components is high. As the probability of occurrence of the poor estimate is low, two of the other estimates are assured to be good. The technique for I/Q imbalance estimation may be enhanced if the imbalance estimate associated with the smallest error can be identified. However, since the estimation error is unknown, it may not be possible to directly identify the smallest error. A median filtering technique, described below, may be performed on the I/Q imbalance estimates to identify and discard the outliers. Presence of only one worse estimate implies that rejecting the outlier automatically enhances the estimation accuracy.

In an embodiment, if at least three independent estimates of the I/Q imbalance parameters are available, then the median filtering operation is performed as follows: Step 1: Sort the I/Q gain imbalance estimates $\{\alpha_1^{-1}, \alpha_2^{-1}, \alpha_3^{-1}\}$ in ascending order and select the middle value as the enhanced gain imbalance estimate $\alpha^{-1}$. Step 2: Sort the I/Q phase imbalance estimates $\{\tan\_\emptyset_1, \tan\_\emptyset_2, \tan\_\emptyset_3\}$ in ascending order and pick the middle value as the enhanced phase imbalance estimate $\tan\_\emptyset$. Step 3: The corresponding sec_Ø parameter is picked. The selected values of the enhanced gain imbalance estimate $\alpha^{-1}$ in step 1 and the enhanced phase imbalance estimate $\tan\_\emptyset$ in step 2 define the filtered set 212. In addition to median filtering, additional techniques of selecting the filtered set 212 may be deployed. For example, a combination of median filtering and averaging may be used for selecting the filtered set 212 from, for example, from a sample of five estimate sets. The five estimate sets may include at least one 1 outlier (e.g., due to correlation between I/Q components). Thus, in an alternative technique, the five estimate sets may be sorted in ascending order and the 2 extremes may be rejected, and an average of the remaining three estimate sets may be computed and used as the filtered set 212.

To avoid some of the limitations imposed by the LUT based approach for the square root inverse computation, a Newton-Raphson based approximation technique is deployed. The problem of finding $y=1/\sqrt{x}$ is simplified to finding the positive root of $f(y)=(1/y^2)-x$. Given an initial estimate $y_n$, (referred to as the 'seed') of y, the Newton-Raphson method computes a better estimate $y_{n+1}$ per Equation E240.

$$y_{n+1} = y_n - \frac{f(y_n)}{f'(y_n)} = y_n * \left(\frac{3 - xy_n^2}{2}\right).$$ Equation E240

The input range of interest may be broken in to few intervals (e.g., 4) with a unique seed. Three iterations are performed to get the final inverse square root estimate. The seed is selected to provide the best performance over each input range. The use of Newton-Raphson based approximation technique assures high estimation accuracy.

Figure 3A:
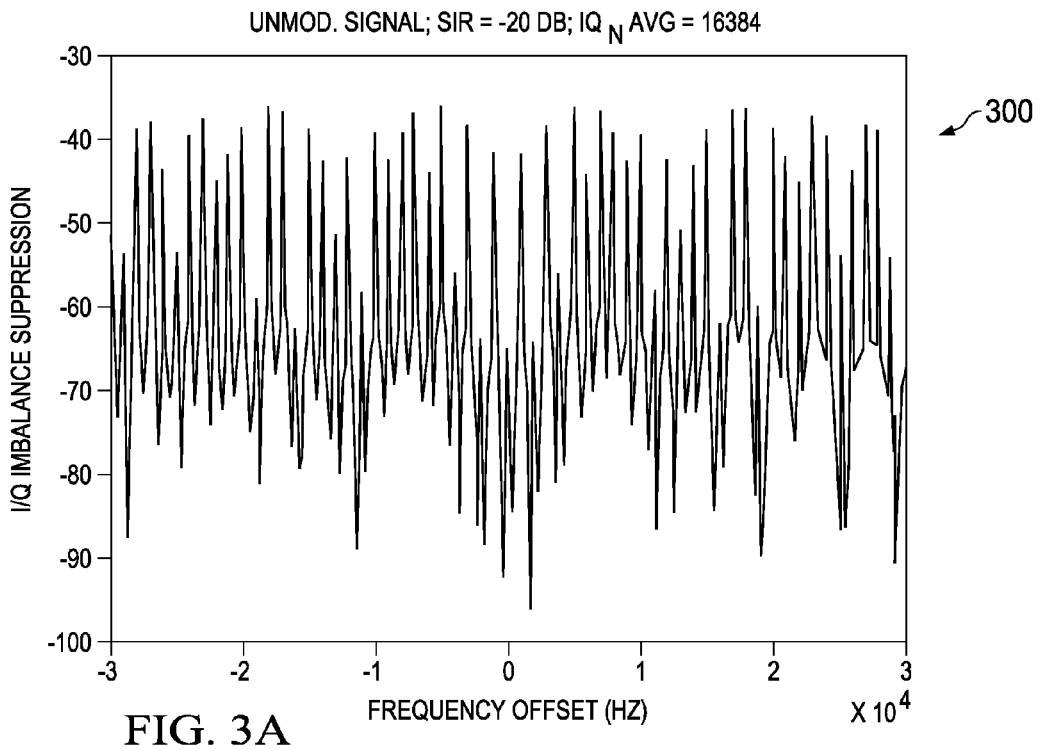
FIG. 3A is a graph illustrating correlated signal processing performance features of the communication device described with reference to FIG. 1.

FIG. 3A is a graph 300 illustrating correlated signal processing performance features of the communication device 100 described with reference to FIG. 1. The graph 300 illustrates the variation in performance of the blind I/Q imbalance estimation for a specific case in which both the signal and image blocker are frequency modulated using an audio tone signal with a frequency of 1 KHz. The communications device 100 described with reference to FIG. 1 is configurable to process received signals that may be correlated or uncorrelated. As described earlier, for correlated signals, a frequency offset is introduced to select the filtered set 212 having reduced error due to I/Q imbalance. The graph 300 of a blind I/Q imbalance suppression (shown on Y-axis, in dB) as a function of frequency offset (shown on X-axis, in 104 Hertz,  denoting to the power of) is illustrated for a correlated signal condition such as a frequency modulation (FM) stereo signal and its image blocker. Both the FM stereo signal and image blocker are generated using a 1 KHz modulation audio tone. In a particular application, the image blocker is specified to be 20 dB larger than the desired signal. An I/Q image suppression of at least 47 dB is specified for this particular application. It may be observed from the graph 300 that the worst case performance occurs at cumulative frequency offsets that are multiples of 1 KHz. These offsets correspond to the case under which there is maximal correlation between the FM stereo signal and the blocker.

Figure 3B:
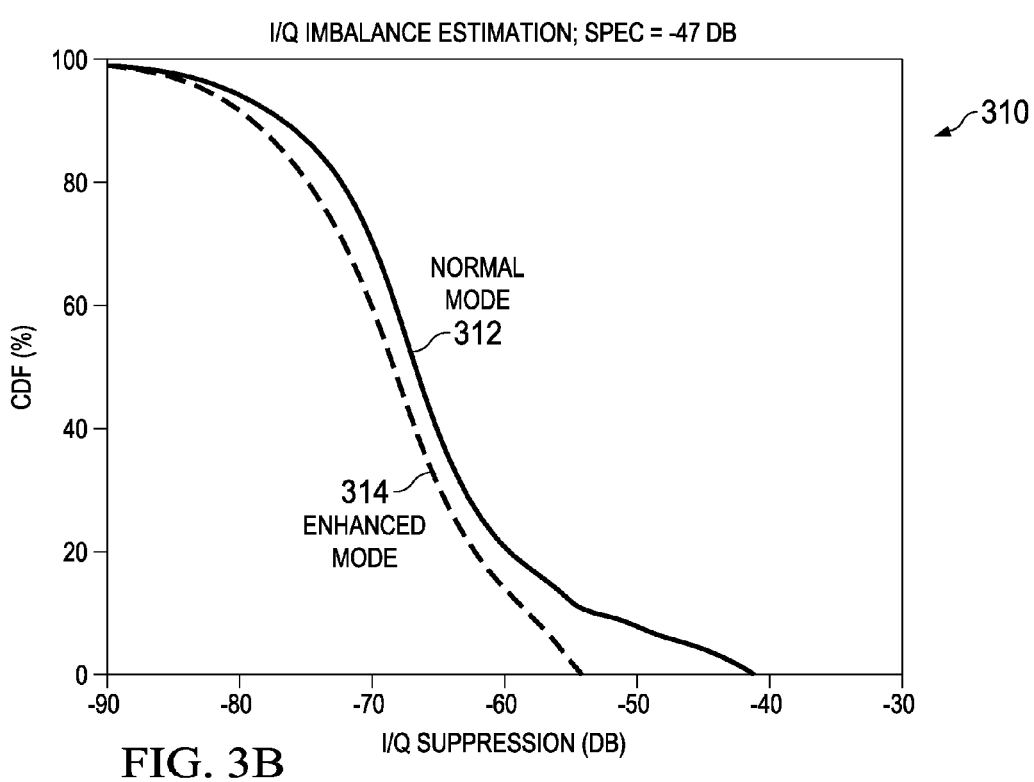
FIG. 3B is a graph illustrating image suppression performance features of the communication device described with reference to FIG. 1.

FIG. 3B is a graph 310 illustrating image suppression performance features of the communication device 100 described with reference to FIG. 1. The graph 310 shows the cumulative distribution (e.g., cumulative distribution function (CDF) (on Y-axis, in %)) of I/Q suppression (on X-axis, in dB). In an embodiment, data used to construct graph 310 may be obtained by various techniques such as using theoretical, empirical, simulation and modeling, and others. The performance of the enhanced blind I/Q estimation technique described with reference to FIGS. 1, 2A, 2B and 2C, may be simulated under the FM stereo image blocker condition over multiple realizations (e.g., by performing Monte-Carlo simulations under different noise scenarios, as well as different unknown phase and frequency offset between the image blocker and the signal).

In order to meet the stereo image blocker specification for a particular application, the image suppression is desired to be greater than 47 dB. The graph 310 includes a performance graph 312 for a conventional I/Q estimator (e.g., an I/Q estimator without having the benefit of using a frequency offset to generate multiple sets of I/Q imbalance parameters and performing median filtering to select a filtered set from the multiple sets) and a performance graph 314 for the communications device 100 described with reference to FIG. 1. With the graph 312 for a conventional I/Q estimator, the image suppression is less than 47 dB for approximately 10% of the realizations. In the worst case, the image suppression is just approximately 42 dB. With graph 314 for the enhanced estimator of communication device 100, an image suppression that is greater than 52 dB is provided for all realizations. Thus, the concept of performing filtering with frequency offset eliminates the outliers in applications where correlation between I/Q components of a baseband signal may be present.

Figure 3C:
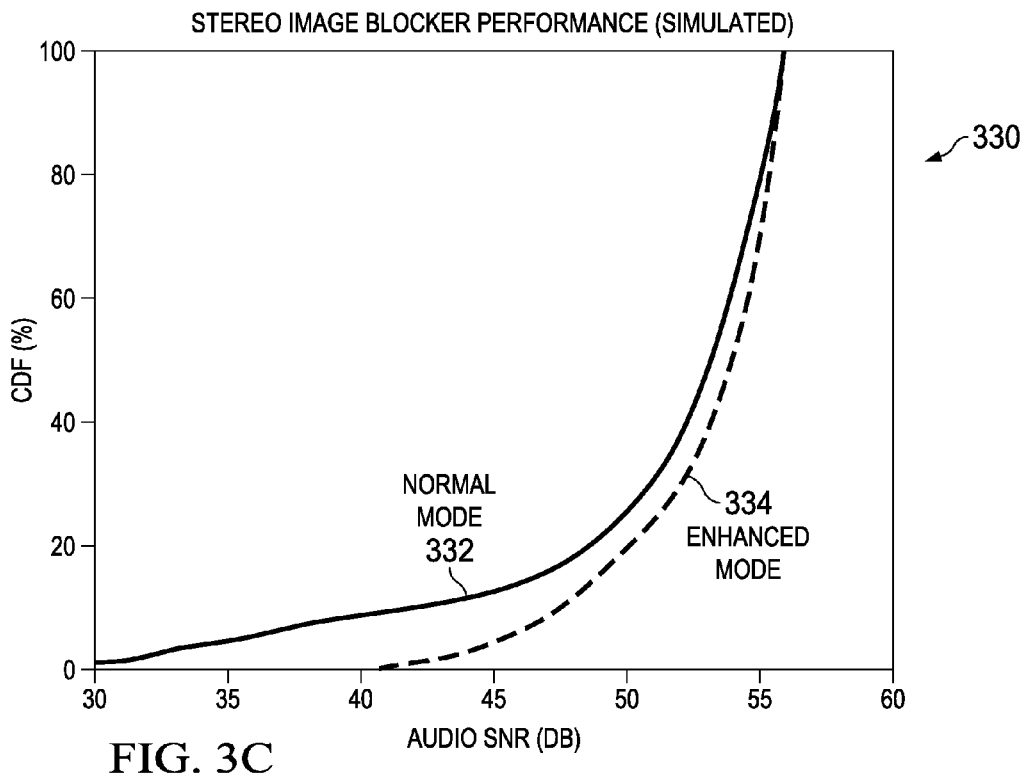
FIG. 3C is a graph illustrating audio signal-to-noise performance features of the communication device described with reference to FIG. 1.

FIG. 3C is a graph 330 illustrating audio signal-to-noise performance features of the communication device 100 described with reference to FIG. 1. The graph 330 shows the cumulative distribution (e.g., cumulative distribution function (CDF) (on Y-axis, in %)) of audio signal-to-noise ratio (on X-axis, in dB). In an embodiment, data used to construct graph 330 may be obtained by various techniques such as using theoretical, empirical, simulation and modeling, and others. The performance of the enhanced blind I/Q estimation technique described with reference to FIGS. 1, 2A, 2B and 2C, may be simulated under the FM stereo image blocker condition over multiple realizations.

In order to meet the stereo image blocker specification for a particular application, the audio signal-to-noise ratio (SNR) is desired to be greater than 40 dB. The graph 330 includes a performance graph 332 for a conventional I/Q estimator (e.g., an I/Q estimator without having the benefit of using a frequency offset to generate multiple sets of I/Q imbalance parameters and selecting a filtered set from the multiple sets) and a performance graph 334 for the communications device 100 described with reference to FIG. 1. The audio SNR performance is compared between the conventional I/Q imbalance estimator and the enhanced I/Q imbalance estimator included in the communication device 100. As shown by graph 332, with the conventional I/Q estimator, audio SNR specification non-compliance is observed in approximately 10% of simulation realizations e.g., CDF of 10% corresponds to SNR of 40 dB). As shown by graph 334 (for the communication device 100), all simulation realizations have a SNR of greater than 40 dB.

Figure 4A:
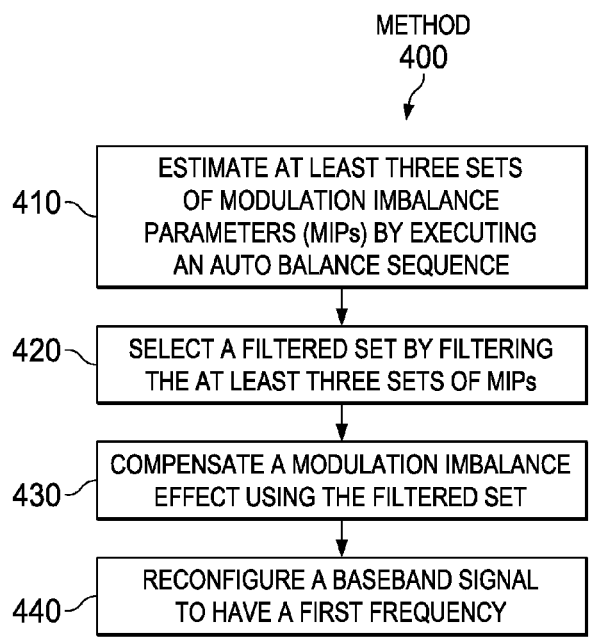
FIG. 4A is a flow chart of a method for compensating a modulation imbalance effect in a communication device, according to one embodiment.

FIG. 4A is a flow chart of a method 400 for compensating a modulation imbalance effect in the communication device 100, according to one embodiment. In an embodiment, the method 400 is used for performing enhanced I/Q imbalance parameter estimation and compensation using the communications device 100 described with reference to FIG. 1. At step 410, at least three sets of MIPs are estimated by executing an auto balance sequence. The at least three sets of MIPs corresponding to a baseband signal are configured to have at least three configurable frequencies and each of the at least three sets of MIPs corresponds to at least one of the three configurable frequencies. The auto balance sequence is configured to provide an offset signal generated within the communication device to trigger generation of each one of the at least three configurable frequencies. At step 420, a filtered set is selected by filtering the at least three sets of MIPs. At step 430, the modulation imbalance effect is compensated using the filtered set. At step 440, the baseband signal is reconfigured to have a first frequency included in the at least one of the three configurable frequencies, the first frequency being configured to be an initial frequency having no corresponding offset.

It is understood, that various steps described above may be added, omitted, combined, altered, or performed in different order. For example, step 410 may be expanded to include sub steps described with reference to FIG. 4B.

Figure 4B:
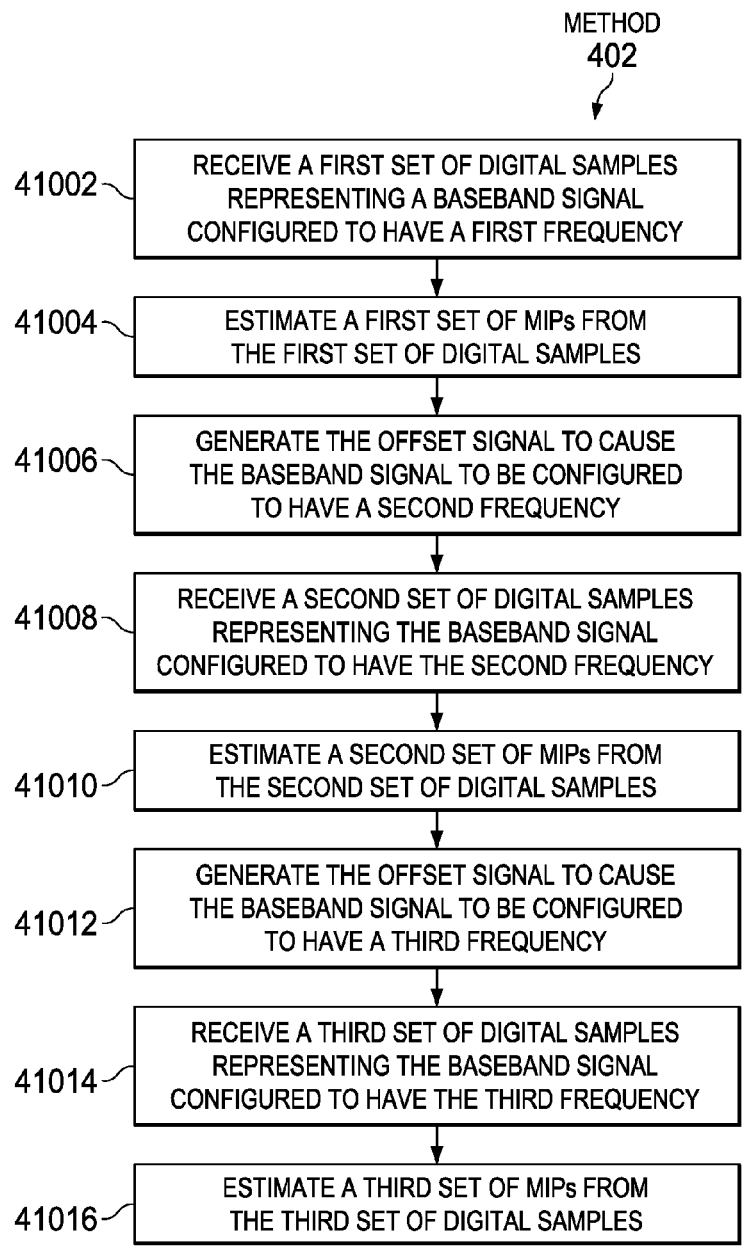
FIG. 4B is a flow chart of a method for executing an auto balance sequence described in step with reference to FIG. 4A to estimate modulation imbalance parameters.

FIG. 4B is a flow chart of a method 402 for executing an auto balance sequence described in step 410 with reference to FIG. 4A to estimate modulation imbalance parameters. In an embodiment, the method 402 is used for performing enhanced I/Q imbalance parameter estimation and compensation using the communications device 100 described with reference to FIG. 1. At step 41002, a first set of digital samples representing the baseband signal configured to have a first frequency is received. At step 41004, a first set of MIPs is estimated from the first set of digital samples. At step 41006, the offset signal to cause the baseband signal to be configured to have a second frequency is generated. At step 41008, a second set of digital samples representing the baseband signal configured to have the second frequency is received. At step 41010, a second set of MIPs from the second set of digital samples is estimated. At step 41012, the offset signal to cause the baseband signal to be configured to have a third frequency is generated. At step 41014, a third set of digital samples representing the baseband signal configured to have the third frequency is received. At step 41016, a third set of MIPs is estimated from the third set of digital samples.

It is understood, that various steps described above may be added, omitted, combined, altered, or performed in different order. For example, a step may be added after step 41016 to generate the offset signal to cause the baseband signal to be configured to have the first frequency.

Figure 5:
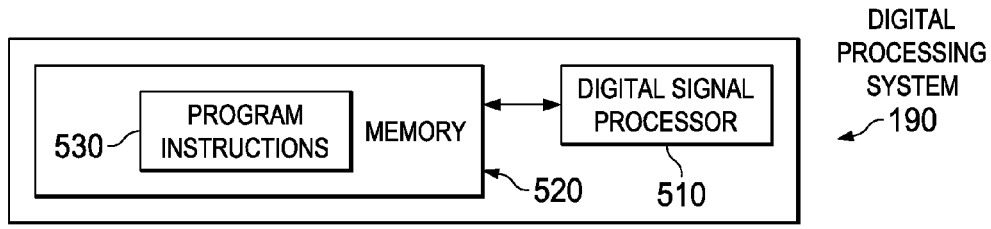
FIG. 5 illustrates a block diagram of the digital processing system described with reference to FIG. 1.

FIG. 5 illustrates a block diagram of the digital processing system 190 described with reference to FIG. 1. The digital processing system 190 includes a digital signal processor 510 coupled to a memory 520. It is understood that more than one processor may be deployed to match desired computing load. The memory 520 is operable to store program instructions 530 that are executable by the digital signal processor 510 to perform one or more functions. It should be understood that the term "digital processing system" is intended to encompass any device having a processor that is capable of executing program instructions from a memory medium. It is understood that the processor may be implemented as any electronic device such as controller, microcontroller, central processing unit, microprocessor, digital signal processor, state machine, programmable logic array, field programmable device, sequential and/or combinatorial logic device, and others. In a particular embodiment, the various functions, steps, processes, methods 400, 402, and operations described herein may be implemented using the digital processing system 190.

The various functions, steps, processes, methods 400, 402, and operations performed or executed by the digital processing system 190 can be implemented as the program instructions 530 (also referred to as software or simply programs) that are executable by the digital signal processor 510 and various types of computer processors, controllers, microcontrollers, central processing units, microprocessors, digital signal processors, state machines, programmable logic arrays, field programmable devices, sequential and/or combinatorial logic devices, and others. In an exemplary, non-depicted embodiment, the digital processing system 190 may be networked (using wired or wireless networks) with other computer systems.

In various embodiments, the program instructions 530 may be implemented in various ways, including procedure-based techniques, component-based techniques, object-oriented techniques, rule-based techniques, among others. The program instructions 530 can be stored on the memory 520 or any computer-readable medium for use by or in connection with any computer-related system or method. A non-transitory computer-readable storage medium is an electronic, magnetic, optical, or other physical device or means that can contain or store computer program logic instructions for use by or in connection with a computer-related system, method, process, or procedure. Programs can be embodied in the non transitory computer-readable storage medium for use by or in connection with an instruction execution system, device, component, element, or apparatus, such as a system based on a computer or processor, or other system that can fetch instructions from an instruction memory or storage of any appropriate type. The non-transitory computer-readable storage medium can be any structure, device, component, product, or other means that can store, communicate, propagate, or transport the program for use by or in connection with the instruction execution system, apparatus, or device.

As described earlier, some receivers deploying analog signal processing may be inherently susceptible to imperfections and mismatched components that often introduce unequal distortions in the processing of I/Q signals. I/Q imbalances may manifest themselves as a gain and phase imbalance in the (I and Q components of the received signal, thereby generating deviations from the desired 90° phase shift and the desired equal gain in the I and the Q branches. The I/Q imbalances, such as amplitude imbalance and phase imbalance, are frequency-dependent and may be highly unpredictable. The communication device 100 described with reference to FIG. 1 addresses these issues and provides an improved blind I/Q imbalance estimation and compensation technique that is independent of correlation between the I and Q components of the received signal.

The communication device 100 described with reference to FIG. 1, may be implemented using the heterodyne and the homodyne (may also be referred to as direct-to-baseband conversion or direct conversion) receiver topologies for receiver circuits. Heterodyne receivers typically include a down-conversion to an IF signal, whereas homodyne receivers typically do not include an IF signal. Thus, heterodyne and homodyne receivers are often referred to as IF and zero-IF receivers, respectively. Homodyne receiver circuits are typically more compact and hence may be better suited to be implemented as an integrated circuit (IC) chip compared to a traditional heterodyne receiver circuit, which typically includes bulky components.

It may be recognized that some blind I/Q imbalance estimation and compensation techniques for I/Q imbalance correction (these techniques may be described to be included in conventional I/Q imbalance parameter estimators) typically operate under the assumption that I and Q components of the received signal are uncorrelated and have the same variance. However, this assumption may be violated under some operating conditions. For example, correlation may exist between positive frequency (used by image blocker, image or blocker) and negative frequency (used by signal of interest) of the baseband signal in a low-IF receiver. In a zero-IF receiver, the correlation may exist between the positive and negative frequencies of the desired signal. Note that in a zero-IF, the signal spans both the positive and negative frequencies. In an FM system (e.g., using 76-108 MHz RF signals), in which both the signal of interest and image blocker may be generated with audio tone as the modulating signal, the I and Q components may be correlated.

As another example, an audio tone modulating an FM carrier may produce spectral components that are harmonics of the tone frequency. An additional example for the FM system may include a scenario in which a silence may be transmitted in the signal and image bands. Under this scenario, the signal and image carriers may be un-modulated and hence correlated. Structured nature of the signal of interest and the blocker signal may result in correlation between them. Furthermore, existence of a correlation between I and Q components may introduce a bias in the I/Q imbalance parameter estimation. The bias, which may depend on the gain and phase imbalance parameters, may degrade receiver performance (e.g., image blocker specification). These challenges are addressed by the communication device 100 described with reference to FIG. 1, which provides an improved blind I/Q imbalance estimation and compensation technique that is independent of correlation between the I and Q components of the received signal.

In accordance with embodiments of the present invention as described above, the performance degradation caused by I/Q imbalance may be minimized in the presence of a non-correlated and correlated signals, thereby maximizing communications efficiency.

The various devices, modules, analyzers, generators, etc. described herein may be enabled and operated using hardware circuitry (e.g., complementary metal-oxide-semiconductor (CMOS) based logic circuitry), firmware, software and/or any combination of hardware, firmware, and/or software (e.g., embodied in a machine readable medium). Further, the various electrical structure and methods may be embodied using transistors, logic gates, and/or electrical circuits (e.g., application specific integrated circuit (ASIC)). Although the present embodiments have been described with reference to specific example embodiments, it will be evident that various modifications and changes may be made to these embodiments without departing from the broader spirit and scope of the various embodiments. For example, the present embodiments are discussed in terms of an FM receiver having low-IF or zero IF frequency. However, the present embodiments can be applied to any communication systems for processing imbalanced signals. In the claims, unless otherwise indicated the article 'a' is to refer to 'one or more than one'. As another example, the present embodiments are independent of multiplexing techniques or communication standards deployed and can be applied to various communication systems such as Code Division Multiple Access (CDMA) systems, Time Division Multiple Access (TDMA) systems, Frequency Division Multiple Access (FDMA) systems, Orthogonal Frequency-division Multiplexing (OFDM) systems, Orthogonal FDMA (OFDMA) systems, and others using IEEE 802.11 and other standards.

What is claimed is:

1. A method for compensating a modulation imbalance effect in a communication device, the method comprising:
   receiving first digital samples representing a baseband signal configured to have a first frequency;
   estimating at least three sets of modulation imbalance parameters from the first digital samples, each set of modulation imbalance parameters having a gain modulation imbalance parameter and a phase modulation imbalance parameter;
   generating a first offset signal to cause the baseband signal to be configured to have a second frequency;
   receiving second digital samples representing the baseband signal configured to have the second frequency;
   estimating at least three sets of modulation imbalance parameters from the second digital samples, each set of modulation imbalance parameters having a gain modulation imbalance parameter and a phase modulation imbalance parameter;
   generating a second offset signal to cause the baseband signal to be configured to have a third frequency;
   receiving third digital samples representing the baseband signal configured to have the third frequency;
   estimating at least three sets of modulation imbalance parameters from the third digital samples, each set of modulation imbalance parameters having a gain modulation imbalance parameter and a phase modulation imbalance parameter;
   filtering the gain modulation imbalance parameters and the phase imbalance parameters at each frequency to obtain a filtered set of modulation imbalance parameters for that frequency, each filtered set of modulation imbalance parameters having a gain modulation imbalance parameter and a phase modulation imbalance parameter; and
   reconstructing input signals with the filtered set of modulation imbalance parameters for each frequency.

2. The method of claim 1 including: reconfiguring the baseband signal to have the first frequency.

3. The method of claim 1, in which the filtering includes:
   sorting each of the gain modulation imbalance parameters and the phase imbalance parameters at each frequency in a configurable order; and
   selecting the filtered set of modulation imbalance parameters from the sorted gain modulation imbalance parameters and the phase imbalance parameters at each frequency, wherein the filtered set has a lower estimation error compared to at least one of the other modulation imbalance parameters, and wherein the filtered set is selected using at least one of a median value-based filter selection criteria and an average value-based filter selection criteria.

4. The method of claim 1 including:
   configuring the baseband signal having at least one of the first frequency, the second frequency and the third frequency such that in-phase (I) and quadrature phase (Q) components of the baseband signal are correlated; and
   offsetting one of the at least one of the first frequency, the second frequency and third frequency having the correlated I/Q components to a different one of the at least one of the first frequency, the second frequency and the third frequency such that the I/Q components are uncorrelated.

* * * * *